US006745371B2

(12) United States Patent
Konstadinidis et al.

(10) Patent No.: US 6,745,371 B2
(45) Date of Patent: Jun. 1, 2004

(54) LOW $V_T$ TRANSISTOR SUBSTITUTION IN A SEMICONDUCTOR DEVICE

(75) Inventors: George K. Konstadinidis, Sunnyvale, CA (US); Harry Ma, Union City, CA (US); Alan P. Smith, Santa Clara, CA (US); Kevin J. Wu, San Jose, CA (US)

(73) Assignee: Sun Microsystems, Inc., Sunnyvale, CA (US)

( * ) Notice: Subject to any disclaimer, the term of this patent is extended or adjusted under 35 U.S.C. 154(b) by 83 days.

(21) Appl. No.: 10/098,756

(22) Filed: Mar. 15, 2002

(65) Prior Publication Data

US 2003/0188268 A1 Oct. 2, 2003

(51) Int. Cl.[7] .............................................. G06F 17/50
(52) U.S. Cl. .............................................. 716/2; 716/1
(58) Field of Search ........................ 716/1–18; 326/95, 326/104; 327/374, 375, 376, 377

(56) References Cited

U.S. PATENT DOCUMENTS

| | | | | |
|---|---|---|---|---|
| 5,774,367 A | * | 6/1998 | Reyes et al. | 364/488 |
| 6,087,886 A | * | 7/2000 | Ko | 327/408 |
| 6,107,834 A | * | 8/2000 | Dai et al. | 326/98 |
| 6,396,749 B2 | * | 5/2002 | Al-Shamma et al. | 365/200 |
| 2002/0099989 A1 | * | 7/2002 | Kawabe et al. | 714/724 |
| 2002/0144223 A1 | * | 10/2002 | Usami et al. | 716/4 |

OTHER PUBLICATIONS

Tripathi et al., "Optimal Assignment of High Threshold Voltage for Synthesizing Dual Threshold CMOS Circuits," IEEE, Jan. 7, 2001, pp. 227–232.*
Fujii et al., "A Sub–IV Dual–Threshold Domino Circuit Using Product–Of–Sum Logic," IEEE, Aug. 7, 2001, pp. 259–262.*
Shibata et al., "A 1–V, 10–MHz, 3.5–Mw, 1–mB MTCMOS SRAM with Charge–Recycling Inpu/Output Buffers," IEEE, Jun. 1999, pp. 866–877.*
Takamiya et al., "High Drive–Current Electrically Induced Body Dynamic Threshold SOI MOSFET (EIB–DTMOS) with Large Body Effect and Low Threshold Voltage," IEEE, Aug. 2001, pp. 1633–1640.*
Elrabaa et al., "A Contention–Free Momino Logic for Scaled–Down CMOS Technologies with Ultra Low Threshold Voltages," IEEE, May 28–31, 2000, pp. I–748–I–751.*
Mutoh et al., "A 1–V Multithreshold–Voltage CMOS Digital Signal Processor for Mobile Phone Application," IEEE, Nov. 1996, pp. 1795–1802.*

*Primary Examiner*—Vuthe Siek
(74) *Attorney, Agent, or Firm*—Zagorin, O'Brien & Graham, L.L.P.

(57) ABSTRACT

Performance of an integrated circuit design, whether embodied as a design encoding or as a fabricated integrated circuit, can be improved by selectively substituting low $V_t$ transistors in a way that prioritizes substitution opportunities based on multi-path timing analysis and evaluates such opportunities based on one or more substitution constraints. By valuing, in a prioritization of substitution opportunities, contributions for all or substantially all timing paths through the substitution opportunity that violate a max-time constraint, repeated passes through a timing analysis phase can be advantageously avoided or limited. In addition, by recognizing one or more constraints on actual low $V_t$ substitutions, particular noise-oriented constraints, the scope of post substitution design analysis can be greatly reduced. In some realizations, substitutions are performed so long as a leakage current budget is not expended. As a result, integrated circuit designs prepared in accordance with the described techniques may exhibit substantial cycle time improvements through judicious selection of gate instances for substitution. In some realizations, improved yields of high grade parts may result.

43 Claims, 6 Drawing Sheets

OTHER PUBLICATIONS

Miyake et al., "Design Methodology of High Performance Microprocessor Using Ultra–Low Threshold Voltage CMOS," IEEE, May 6–9, 2001, pp. 275–278.*

MC Pherson, T., et al., 760MHz G6 S/390 Microprocessor: Exploiting Multiple Vt and Copper Interconnects, IEEE International Solid–State Circuits Conference, Feb. 7, 2000, pp. 96–97.

* cited by examiner

LOW $V_T$ TRANSISTOR SUBSTITUTION IN A SEMICONDUCTOR DEVICE

BACKGROUND

1. Field of the Invention

The present invention relates generally to techniques for designing and optimizing semiconductor devices and, in particular, to automated techniques for substituting low $V_t$ transistor, gate or cell instances in a semiconductor design.

2. Description of the Related Art

A major challenge faced in the design of semiconductor devices, such as in the design of high-speed microprocessors, is to identify methods of increasing clock speeds for the processor while also managing semiconductor device process limitations. For example, use of low threshold voltage transistors (low $V_t$) may allow increases in operating frequency but may also negatively impact other design factors, such as leakage current, noise, and minimum timing design requirements. Accordingly, wholesale use of low $V_t$ transistors is undesirable, and often impossible. Ad hoc substitution of low $V_t$ transistors in semiconductor design is impractical, particularly in large-scale designs that include tens of millions of transistors. Accordingly, there is a need for improved techniques whereby low $V_t$ transistors may be selectively substituted in a semiconductor design, while appropriately managing other design factors.

SUMMARY

It has been discovered that the performance of an integrated circuit design, whether embodied as a design encoding or as a fabricated integrated circuit, can be improved by selectively substituting low $V_t$ transistors in a way that prioritizes substitution opportunities based on multi-path timing analysis and evaluates such opportunities based on one or more substitution constraints. By valuing, in a prioritization of substitution opportunities, contributions for all or substantially all timing paths through the substitution opportunity that violate a max-time constraint, repeated passes through a timing analysis phase can be advantageously avoided or limited. In addition, by recognizing one or more constraints on actual low $V_t$ substitutions, particular noise-oriented constraints, the scope of post substitution design analysis can be greatly reduced. In some realizations, substitutions are performed so long as a leakage current budget is not expended. As a result, integrated circuit designs prepared in accordance with the described techniques may exhibit substantial cycle time improvements through judicious selection of gate instances for substitution. In some realizations, improved yields of high grade parts may result.

The developed substitution techniques are, in general, applicable at a variety of levels of device/feature aggregation, such as at the individual device, transistor or FET gate level, at the logic gate or standard cell level, or at larger circuit block levels. In each case, a low $V_t$ instance may be selectively substituted for a standard or nominal $V_t$ instance. Persons of ordinary skill in the art will appreciate that a low $V_t$ logic gate instance or circuit block may, in general, include one or more low $V_t$ devices or transistors. Prioritization and selective substitution may be made at any level of aggregation appropriate to a particular integrated circuit design and/or design environment. For purposes of clarity, much of the description that follows is couched in the context of instances of standard cells that implement logic gates. Accordingly, in some realizations, particular gate instances and low $V_t$ gate instances may correspond to instances of standard cells and timing analyses and substitutions will be performed at levels of aggregation corresponding to such instances and networks thereof. However, more generally, the terminology "gate instance" and "low $V_t$ gate instance" will be understood to include instances of integrated circuit structures and features ranging from individual instances of devices, transistors or gates, to individual instances of logic gates or flops, to instances of circuit blocks. Of course, not all transistors or other devices of a low $V_t$ logic gate or circuit block need be low $V_t$ transistors or devices and suitable designs, including standard cell designs, for low $V_t$ logic gates or circuit blocks will be understood by persons of ordinary skill in the art.

In view of the foregoing, and without limitation, aspects of an exemplary exploitation of the developed techniques are now described in the context of networks of standard cell logic gate instances, timing analysis thereof, substitution constraints, such as node capacitance limits or RC delay limits at gate inputs, and substitutions with low $V_t$ variants of the standard cells. Based on the description herein, persons of ordinary skill in the art will appreciate suitable exploitations for gate instances at larger or smaller levels of aggregation.

BRIEF DESCRIPTION OF THE DRAWINGS

The use of the same reference symbols in different drawings indicates similar or identical items.

DETAILED DESCRIPTION

Figure 1:
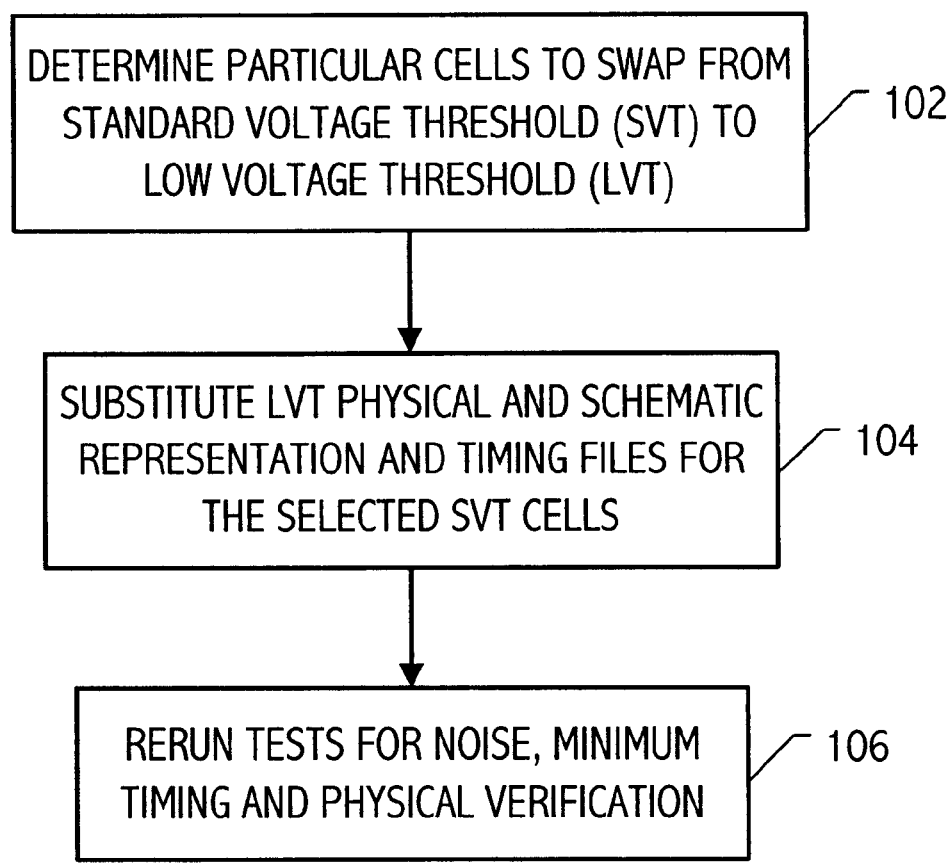
FIG. 1 is a flow chart that illustrates a method of processing a design for a semiconductor device.

Referring to FIG. 1, a method of processing a computer representation of design elements of a semiconductor device is illustrated. The method includes determination (102) of particular design instances of standard threshold voltage (standard $V_t$) logic cells to swap for low threshold voltage (low $V_t$) instances. After determining the particular cell instances for substitution, the particular cell instances are swapped by substituting (104) information corresponding to low $V_t$ physical files, low $V_t$ schematic representations, and low $V_t$ timing files for that associated with respective standard $V_t$ cells. In a particular implementation, two substantially co-extensive cell libraries may be provided. For example, a standard $V_t$ library may be provided that includes standard $V_t$ type transistors, circuit and gate configurations implementing cells of the library, while a low $V_t$ library includes low $V_t$ type transistors, circuit and gate configurations implementing corresponding cells. In such an implementation, swapping a particular cell instance from standard $V_t$ to low $V_t$ simply involves substituting information for a corresponding cell from a different library. After the selected cells of the design have been substituted from standard $V_t$ to low $V_t$ cells, design verification tests, such as noise tests, minimum timing tests, and physical verification tests, may be re-executed (106) to verify the new design that includes the substituted low $V_t$ cells.

Figure 2:
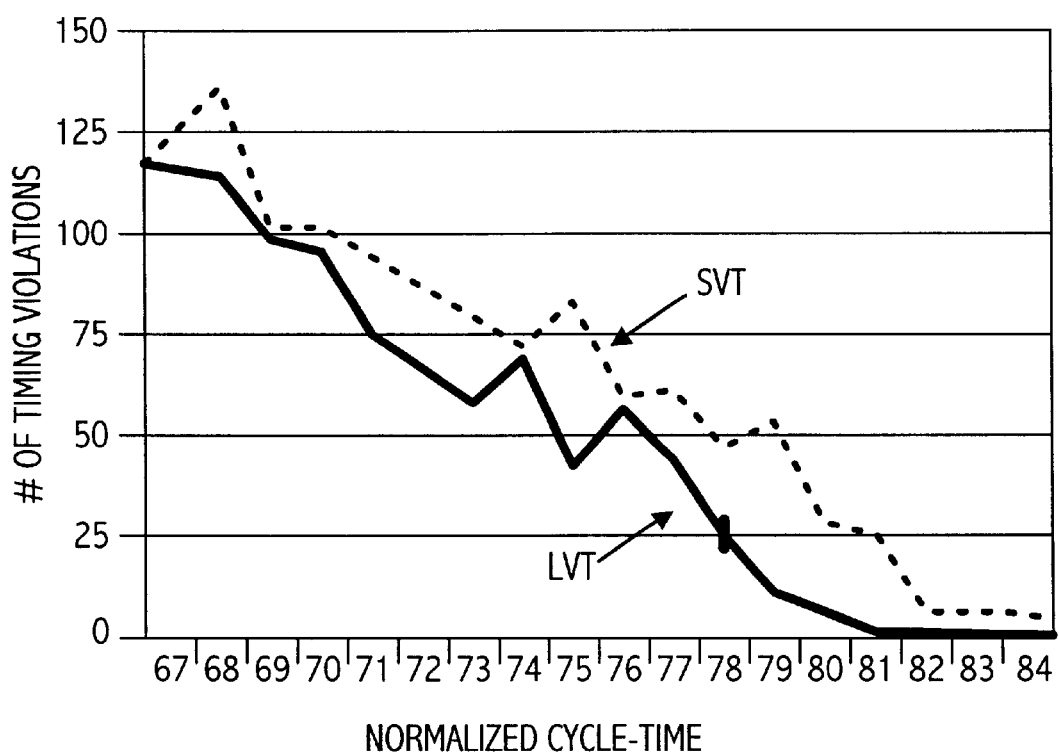
FIG. 2 is a general illustration of a graph relating to standard and low threshold voltage transistors.

An advantageous characteristic of low $V_t$ cells is reduced delay as compared to corresponding standard $V_t$ cells. As a result, use of a low $V_t$ cell instance in substitution for a cell instance that contributes to a max-time violation in a timing path may allow an integrated circuit design to operate at a higher frequency. Indeed, use of low $V_t$ transistors may improve cycle time by 15% in certain gate-dominated delay paths. If low $V_t$ cell substitutions are prioritized and applied in a way that does not unacceptably degrade other characteristics of a semiconductor device, such as noise susceptibility, margins and/or overall leakage current, improved device performance and/or yield at grade can be achieved. Preferably, substitutions made during a design phase can be constrained to obviate a full-battery of post-substitution timing analysis. Improved performance can be particularly desirable in integrated circuits, such as microprocessor integrated circuits, where high-speed-grade parts demand a substantial premium in the marketplace. FIG. 2 demonstrates an exemplary reduction in speed-grade limiting timing violations resulting from the techniques described herein to a microprocessor design. By selectively substituting low $V_t$ cells, critical timing violations are eliminated, as evidenced by the shifting of the tail of the illustrated histogram, and resulting microprocessor integrated circuits can be expected to operate at a higher frequency.

While low $V_t$ cells offer reduced delay, they also tend to exhibit a higher leakage current than standard $V_t$ cells. Many applications for high-speed processors also require low current and power usage. Accordingly, while such applications can benefit from substitution of many cells with low $V_t$ cells, wholesale substitution of all cells is generally not acceptable since such substitution tends to result in leakage current and noise levels that exceed design requirements. In addition, low $V_t$ transistors are generally more sensitive to voltage variations at their input gates. Accordingly, certain otherwise desirable substitution opportunities may be undesirable when particular electrical characteristics of input nets are considered.

Figure 3:
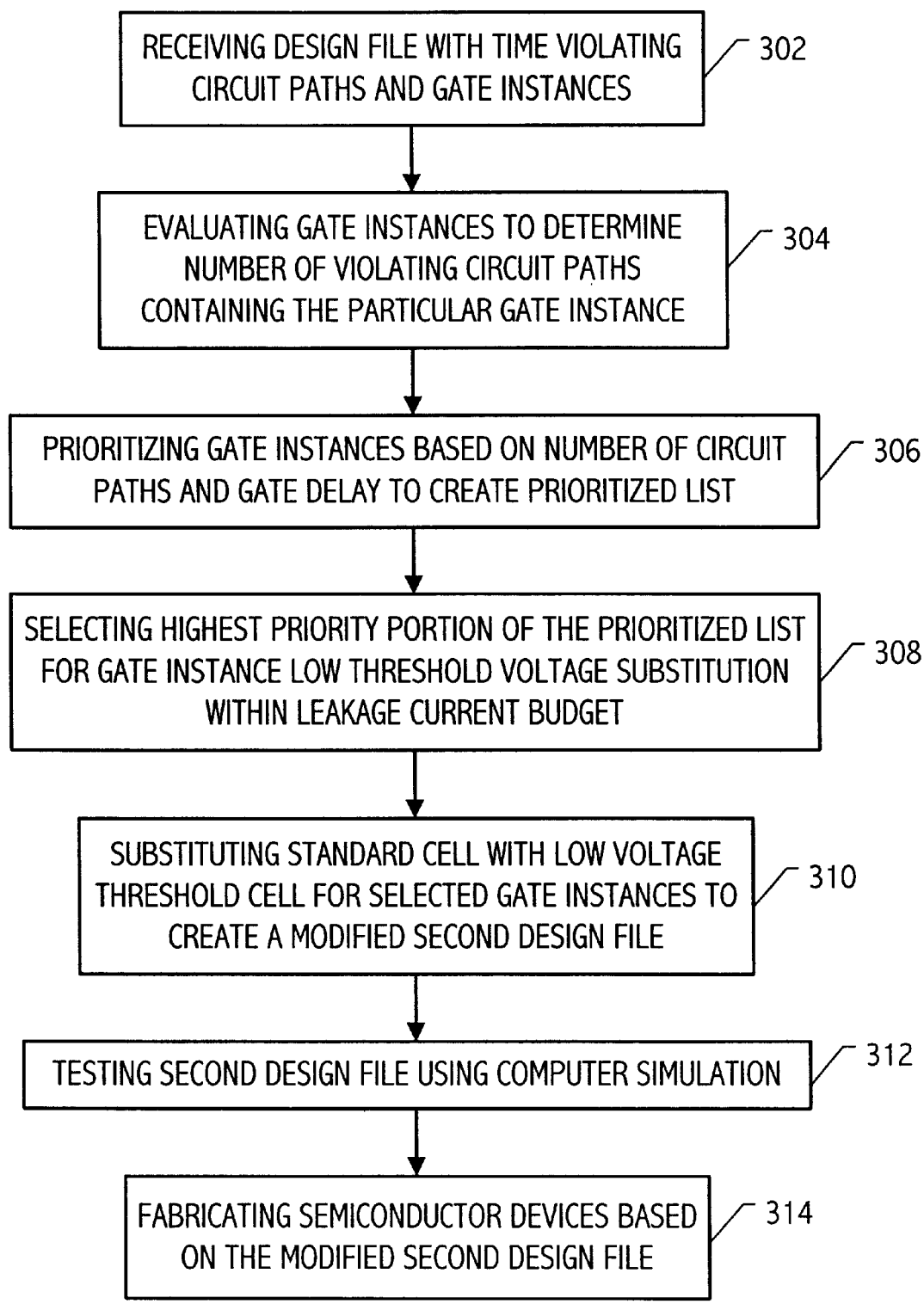
FIG. 3 is a flow chart that illustrates a method of processing design files.

FIG. 3 illustrates in further detail a method of processing design files for a semiconductor device. A portion of a design file for a semiconductor device that contains max-time violating circuit paths is received or accessed at 302. Each of the max-time violating circuit paths, i.e., those circuit paths having a signal propagation delay that exceeds a desired end-to-end timing requirement, typically contain multiple circuit elements, cells, transistors, or more generally, gate instances, for which substitution with a low $V_t$ instance may be possible. For example, in a circuit path characterized primarily by logic delays through standard cell implementations of logic gates, substitutable gate instances may implement logic gate such as a logic "and" or a logic "or" function, while in others, substitutable gate instances may correspond to larger or smaller aggregations of circuit features, including circuit blocks or individual transistor gate instances. Of course, as previously described, an appropriate level of aggregation for gate instances may vary from exploitation to exploitation, and indeed, even within a given exploitation. Accordingly, as before, persons of ordinary skill in the art will appreciate a suitable range of exploitations based on the description herein.

A set of gate instances is prioritized based on a metric that tends to emphasize those gate instances that contribute significantly to larger numbers of those time violating circuit paths that exhibit the greatest violations. While any of a variety of metrics may be suitable, and may fall within the scope of claims that follow, a particular metric is illustrative.

$$FOM_i = \sum_{j=1}^{count_i} violation_j \times delay_j,$$

where $violation_j$ is a measure of timing violation for path j of $count_i$ maximum time violating paths through gate instance i and $delay_i$ is a weighting factor based on delay through gate instance i. In calculating such a metric, FOM, it may be desirable to eliminate or skip those gate instances for which substitution may not be appropriate. For example, in some realizations, a low $V_t$ instance may not exist for certain design features and prioritization can be forgone. Similarly, in some realizations, certain gate instances may not be considered for substitution. For example, flops or more generally gate instances or cells with min-time design requirements may be eliminated from consideration or skipped. Whatever the appropriate set or subset of gate instances, they are prioritized based on a metric that incorporates contributions for multiple time violating paths therethrough.

Referring to FIG. 3, a metric may include contributions corresponding to each time violating circuit path that includes a gate instance and which is weighted based on the gate delay for the particular gate instance (see 306). A prioritized set of the gate instances is created. Based in part on a leakage current budget, a subset of the gate instances from the prioritized list are selected (308) for low $V_t$ substitution. For example, for each of the selected gate instances, a standard cell may be substituted with low $V_t$ version of the cell and a design file, referred to as a second design file, is created at 310. Whether the second is a new design file, a revised version of a first design file, or set of overrides is generally a matter of design preference. In any case, the second design file encodes (either in whole or in part) representations for the low $V_t$ substituted cells. A resulting design that includes the low $V_t$ substituted cells is then tested at 312. Such testing may include design rule tests, noise tests, and for minimum timing tests. Such tests are typically performed using computer-based software tools. After testing the second design, the second design may then be used to create masks for fabricating a semiconductor device to be constructed in accordance with the second design. The semiconductor device may then be fabricated at 314. In general, any of a variety of suitable fabrication methods may be employed.

Figure 4A:
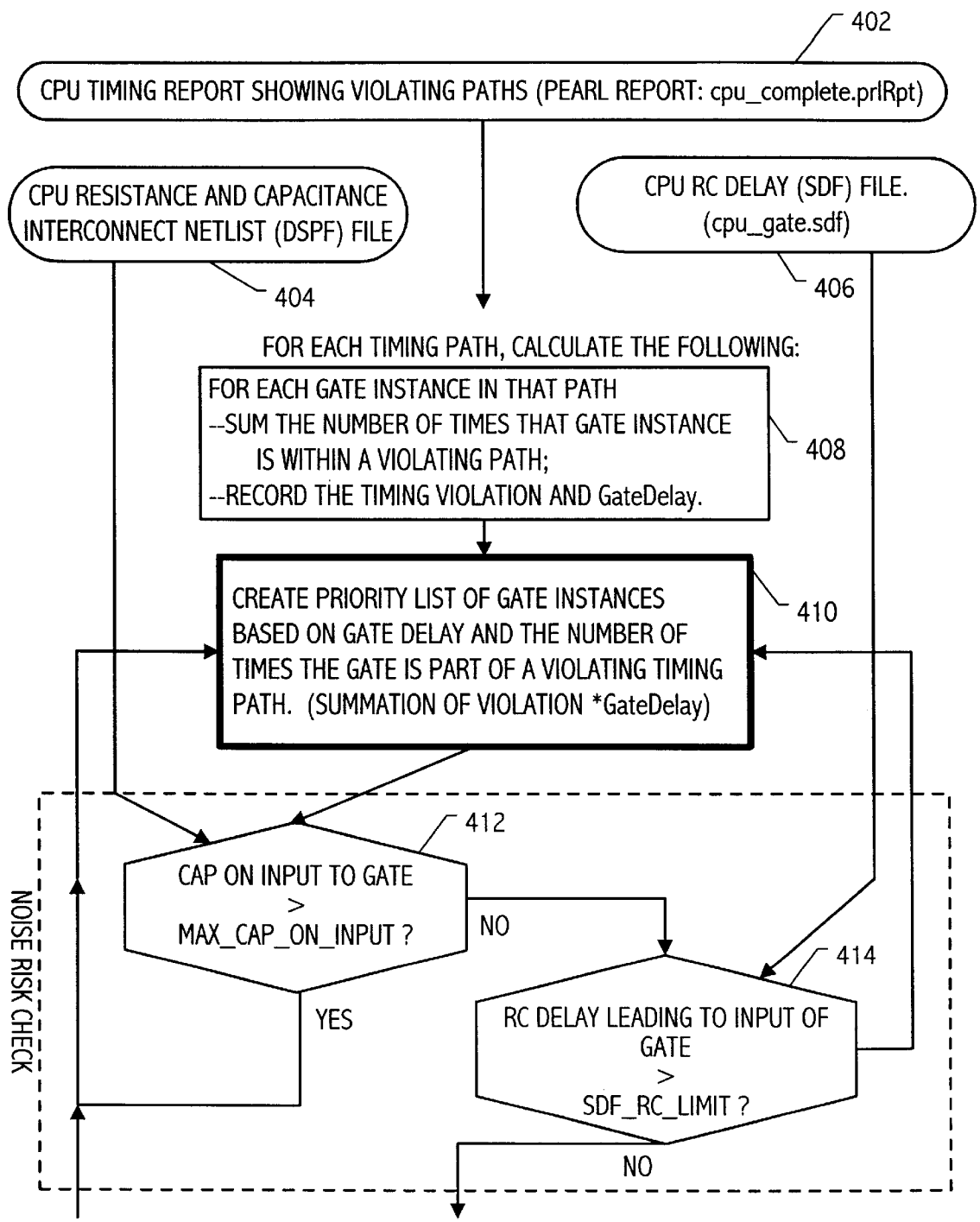
FIGS. 4A and 4B illustrate a further detailed method of processing design files and fabricating a semiconductor device.
Figure 4B:
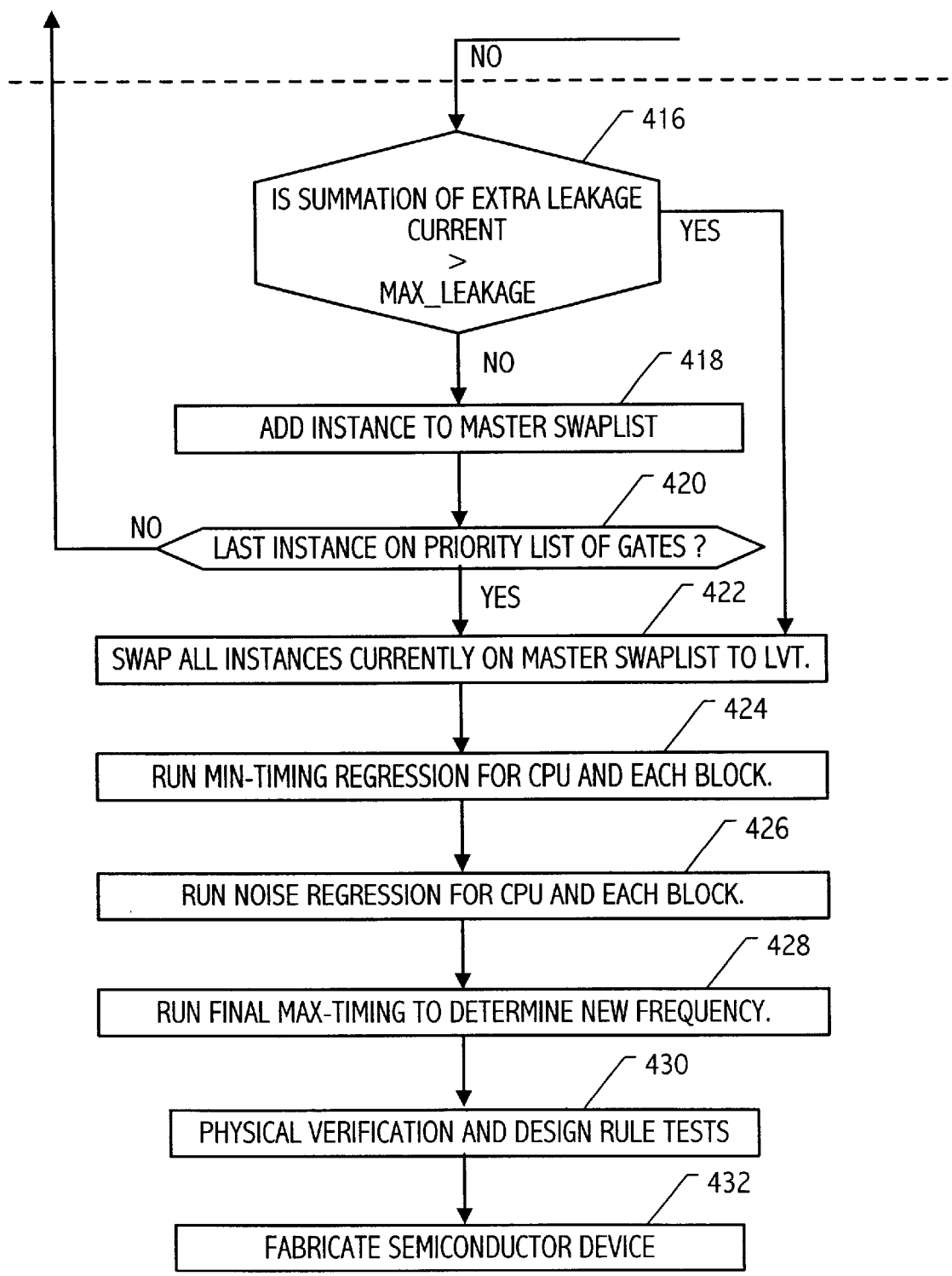

Referring to FIGS. 4A and 4B, another representation of a method of processing a design file for a semiconductor device is shown. A timing report for a microprocessor design that shows time violating circuit paths is received or accessed at 402. By evaluating this first input file, which may be a Pearl timing report, an analysis of each timing path violation may be conducted. In a typical realization, the timing path violation report lists the devices (including gates that are in the timing path) and separates the delay into two components: wire delay and gate delay. The method flow then parses the time report to identify timing paths in the report and creates a database for each gate instance in the design. That is, for each gate instance the method determines (1) the number of times that such gate instance is part of a violating timing path; and (2) calculates the summation, over each of these instances, of the path timing violation multiplied by the gate delay. This calculation provides a weighted metric that represents a benefit from swapping this particular gate instance to a low $V_t$ cell. Then, this set of gate instance entries may be sorted in priority order according to those gates that would have the most impact on cycle-time.

Logically, the gate instances with larger intrinsic delays that are located inside of relatively more violating timing paths would be near the top of this prioritized list. This summation and weighted contribution can be denoted as:

Priority+=Violation*GateDelay

It should be noted that the database created is based on gate instances, not based on merely the cell name. Since instances of a particular cell may be using in an integrated circuit design at many locations, there are typically many gate instances that correspond to a particular standard cell design. The design is analyzed to identify those instances can be swapped for low $V_t$ variants to improve performance of the integrated circuit design. For example, a particular standard cell design for a particular N-input logic gate may be used 250 times in an integrated circuit design. Accordingly, the integrated circuit design includes 250 gate instances corresponding to the standard cell. However, each instance plays a different role in performance of the integrated circuit design. For example, some instances may not be part of any max-time violating circuit path. On the other hand, a single one of the 250 instances may be part of 63 different max-time violating paths. Also, this one gate instance may exhibit a delay of 59 ps and may be the single greatest contributor to violations in the 63 timing paths. If a low $V_t$ instance of the N-input logic gate is 8 ps faster than a standard $V_t$ instance, then the substitution of just one gate instance for a low $V_t$ variant could improve the cycle-time of each of 63 different timing paths by approximately 8 ps.

Accordingly, using techniques such as described above, at least a subset of gate instances is prioritized for a given integrated circuit design. While some realizations may result in an absolute ordering, partial orderings or a simple selection of a subset of worst offender gate instances may be sufficient prioritization in some realizations. Based on the description herein, persons of ordinary skill in the art will appreciate suitable prioritizations for a given design and/or computational environment and the claims that follow may be understood to encompass a variety of such prioritizations. Given such a prioritization, selection of particular gate instances for substitution is now described.

In general, any of a variety of substitution constraints can be applied in various realizations of present invention. For example, in one realization, a leakage current budget constraint and two noise-related constraints are applied in the selection of gate instances from the prioritized set. Other realizations may employ these or other similar constraints, depending on implementation-specific design considerations. Nonetheless, aspects of the present invention will be understood in the context of the following exemplary substitution constraints: a limit on capacitance at inputs of a substitution candidate, a limit on RC delay leading into inputs of a substitution candidate, and a total leakage current limit, or budget, expended incrementally as candidate gate instances are substituted for low $V_t$ variants. Embodiments of the present invention may exploit some or all of these or other similar constraints.

We now focus on exemplary noise-related constraints, referring to FIGS. 4A and 4B. One factor in determining whether a particular gate instance is a good candidate for a low $V_t$ substitution is capacitance at inputs of a substitution candidate. For example, a capacitance value for an input (or inputs) of a particular gate instance is compared to a maximum capacitance value for such input at 412. In the particular design process of FIG. 4A, if the capacitance at an input to the particular gate instance is greater than the maximum capacitance value, then the gate instance is discarded as a low $V_t$ substitution candidate and evaluation of candidates continues at 410. If the capacitance value for the gate instance does not exceed the maximum capacitance value, other noise related constraints may be evaluated. Ordering of such evaluations is somewhat arbitrary although evaluations that involve simpler computations may be computed first in some realizations. In some realizations, a flattened RC interconnect netlist may be accessed to determine capacitance at inputs to particular gate instances.

Since a low $V_t$ transistor (or more generally, a gate instance that includes one or more low $V_t$ transistors) is, in general, more sensitive to voltage variations on its input gate(s), a capacitance constraint helps to ensure that a standard $V_t$ instance is not swapped for a low $V_t$ instance if its input(s) is (are) coupled to highly capacitive (i.e., noisy) nets. Although a suitable maximum capacitance value is, in general, design specific, a 0.30 pf capacitance limit has been found to be suitable for some designs.

Another factor in determining whether a particular gate instance is a good candidate for a low $V_t$ substitution is RC delay leading into inputs of a substitution candidate. In this case, we are checking not just the capacitance of the net, but the RC component connected to the input of the gate instance. In some realizations, an RC delay file may be consulted for suitable characterizations at inputs of particular candidate gate instances. The RC delay value leading to the input of the particular gate instance is compared to a standard delay format (SDF) RC limit threshold at 414. If the RC delay value exceeds this RC delay threshold, then the particular gate instance is discarded as a low $V_t$ substitution candidate and evaluation of candidates continues at 410. If the RC delay value does not exceed the RC limit threshold, then the substitution constraint evaluation proceeds. Although a suitable maximum RC delay limit is, in general, design specific, a 20 ps delay limit has been found to be suitable for some designs.

Each low $V_t$ substitution incrementally contributes to an increase in overall leakage current. Accordingly, at decision step 416, an accumulation of the extra leakage current (including the contribution associated with the low $V_t$ substitution candidate) is compared to a maximum leakage current threshold. If the accumulated sum of extra leakage current is less than or equal to the maximum leakage threshold at 416, then the particular gate instance is added to a master low $V_t$ substitute swaplist at 418. Next, a decision check is performed to determine if the gate instance is the last gate instance on the priority list at 420. If the evaluated gate instance is the last instance on the list, then the gate instance evaluation loop is exited and processing continues to step 422. However, if the gate instance is not the last gate instance on the list, then processing continues back at step 410 for the next gate instance candidate.

After processing all gate instances on the priority list, as determined at decision step 420, or after expending the maximum leakage current budget at 416, processing of the method continues at step 422. At this point in the process, all gate instances that are on the master swaplist are then substituted for low $V_t$ cell types.

Figure 5:
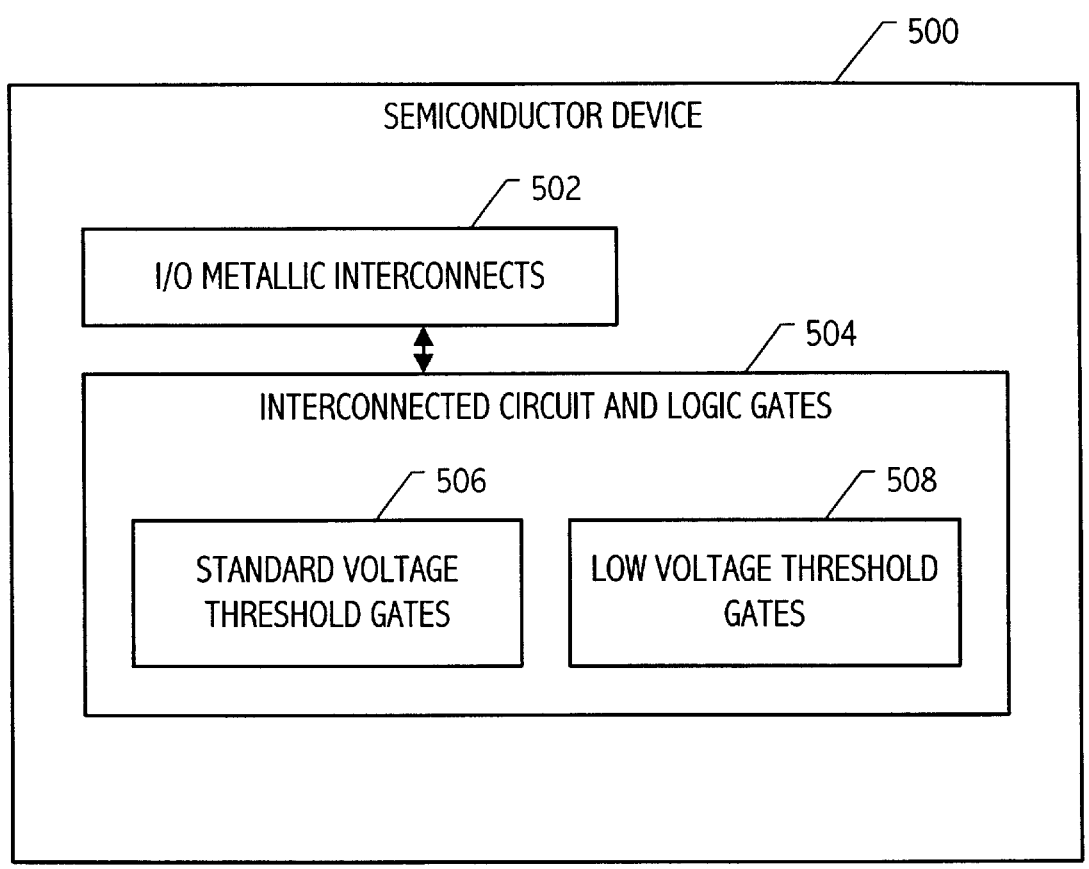
FIG. 5 is a general diagram that illustrates a semiconductor device constructed based on a modified design.

Referring to FIG. 5, an illustrative semiconductor device 500 constructed in accordance with the method described herein and with substituted low $V_t$ gate instances is shown. The semiconductor device 500 includes input/output interconnects 502 and interconnected circuit and logic gate portion 504. Any of a variety of integrated circuit designs may be appropriate; however, the circuit and logic gate portion 504 of the semiconductor device includes both standard $V_t$ threshold gate instances 506 and substituted low $V_t$ gate instances 508. By providing low $V_t$ gate instances 508, operating frequency for the particular semiconductor device 500 is increased and performance is improved. In addition, by using the illustrated methodology, an overall current leakage budget is maintained such that the semiconductor device 500 is within the suitable current leakage requirements.

Design Considerations for an Exemplary Implementation

In some realizations, the actual swapping for cell instances from instances based on the standard $V_t$ library to the low $V_t$ library can be performed at the control logic standard cell place&route blocks and datapath blocks. For a block level low $V_t$ swapping phase there are, in general, two types of swapping: netlist swaps and opus view swaps. Opus view swaps are done on layout and schematics. In the layout view of the software tool executed on an appropriate type of computer system or engineering workstation, a SKILL routine is used to swap the standard $V_t$ cell instances to low $V_t$ cell instances. For modification of the schematic, the user may take the low $V_t$.vL netlist and perform verilogIn in Opus to create the schematic.

In general, it can be difficult to take hierarchical data path block schematics that have dpmacros and swap specific instances because the dpmacros are arrayed instances of cells. Since the low $V_t$ flow is designed to swap specific instances, it would be difficult to swap entire arrays of instances described by dpmacros. So instead, a verilogIn operation may be performed for both place&route and datapath schematics, which creates a flat schematic with symbols connected "by name." A schematic that is connected "by name" means that it derives its connectivity by the names of the pins on the symbols, rather than drawing thousands of nets to connect the flat schematic symbols.

An added benefit of using verilogIn is that the schematic has the same connectivity as the .vL netlist for the design. During an engineering change order (ECO) mode, an error may have occurred if the .vL netlist and the schematic were edited out of sync. So, if the low $V_t$ block is layout versus schematic (LVS) clean after schematic generation, then the .vL file and layout are synchronized.

Once all the netlists, layouts and schematics have been swapped to low $V_t$, then minimum-timing regression tests can be run on each block to make sure that paths were not sped up to the point of causing min-time violations. Referring again to FIG. 4, a minimum timing regression test for a CPU level and at each block level for the new design with the substituted low $V_t$ gates is then executed at 424. A noise regression test at the CPU and at the block level is performed at 426, and a final maximum timing test is executed to determine a new frequency for the processor device design at 428. A physical verification design rule test is performed at 430, and, upon completion of the testing, a semiconductor device with the new design is then fabricated at 432. Other post substitution design qualifications may be performed in other realizations.

An automated computer software semiconductor design tool, such as the commercially available Design Framework II (Opus) software tools available from Cadence Design Systems, Inc. may be used to process the design files and to implement the particular methodology disclosed in this application. In addition, design tools that support Verilog or other hardware description languages may be employed. On the other hand, based on the description herein, persons of ordinary skill in the art will appreciate a variety of other implementations suitable for this and other design environments and languages. Terminology used herein, which is particular to the above-identified design environments or languages, is meant to be illustrative and modifications, extensions and analogs suitable for other design environments will be appreciated based on the description herein. Such modifications, extensions and analogs may fall within the scope of claims that follow.

The above-disclosed subject matter is to be considered illustrative, not restrictive, and the appended claims are intended to cover all modifications and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method for use in connection with an integrated circuit design, the method comprising:
    prioritizing instances of at least some gates of the integrated circuit design using a metric that includes contributions corresponding to timing violations of plural paths therethrough; and
    selecting, substantially in accordance with the prioritization and based at least in part on a substitution constraint, a subset of the gate instances for substitution with respective low $V_t$ variants thereof.

2. The method of claim 1,
    wherein the substitution constraint includes at least one noise-related constraint evaluated at inputs of the prioritized gate instances.

3. The method of claim 2,
    wherein the noise related constraint includes a node capacitance limit at each input of the prioritized gate instances.

4. The method of claim 2,
    wherein the noise related constraint includes a limit on RC delay leading into each input of the prioritized gate instances.

5. The method of claim 1,
    wherein the substitution constraint includes a limit on leakage current accumulated as a result of the gate instance substitutions.

6. The method of claim 1,
    wherein, for each particular gate instance, the metric includes an accumulation of contributions corresponding to substantially each timing path therethrough that violates a timing constraint.

7. The method of claim 1,
    wherein, for each particular gate instance, the metric includes a weighted sum of timing violations for substantially each timing path therethrough that violates a maximum delay constraint on the timing path.

8. The method of claim 7,
    wherein the weighted sum is weighted at least in part based on delay through the particular gate instance.

9. The method of claim 1,
    wherein, for a particular gate instance i, the metric substantially approximates $$FOM_i = \sum_{j=1}^{count_i} violation_j \times delay_i,$$

where $violation_j$ is a measure of timing violation for path j of $count_i$ maximum time violating paths through gate instance i and $delay_i$ is a weighting factor based on delay through gate instance i.

10. The method of claim 1, further comprising:
    substituting, in the integrated circuit design, the selected gate instances for the respective low $V_t$ variants thereof.
11. The method of claim 10,
    wherein each substituted gate instance incurs a corresponding leakage current penalty; and
    wherein the substituting is limited by a leak current budget.
12. The method of claim 10, further comprising:
    fabricating an integrated circuit including substituted low $V_t$ gate instances.
13. The method of claim 1, further comprising:
    preparing the integrated circuit design and thereafter performing the prioritizing and selecting for substitution.
14. A method of processing one or more design files for a semiconductor integrated circuit, the one or more design files encoding representations of a plurality gate instances and circuit paths therethrough, the method comprising:
    prioritizing at least a subset of the gate instances based on a metric that combines timing violations for each of plural paths therethrough that violate a delay constraint; and
    substituting at least some of the gate instance representations with respective low threshold voltage variants thereof, wherein the substitution is performed substantially in prioritized order and subject to a noise-related constraint evaluated at inputs of the prioritized gate instances.
15. The method of claim 14,
    wherein the noise-related constraint includes a node capacitance limit at each input of the prioritized gate instances.
16. The method of claim 14,
    wherein the noise-related constraint includes a limit on RC delay leading into each input of the prioritized gate instances.
17. The method of claim 14,
    wherein the substitution is further subject to a constraint on leakage current accumulated as a result of the gate instance substitutions.
18. The method of claim 14,
    wherein, for each particular gate instance, the metric includes an accumulation of contributions corresponding to substantially each timing path therethrough that violates a timing constraint.
19. The method of claim 14,
    wherein, for each particular gate instance, the metric includes a weighted sum of timing violations for substantially each timing path therethrough that violates a maximum delay constraint on the timing path, and
    wherein the weighted sum is weighted at least in part based on delay through the particular gate instance.
20. The method of claim 14,
    wherein, for a particular gate instance i, the metric substantially approximates $$FOM_i = \sum_{j=1}^{count_i} violation_j \times delay_i,$$

where $violation_j$ is a measure of timing violation for path j of $count_i$ maximum time violating paths through gate instance i and $delay_i$ is a weighting factor based on delay through gate instance i.
21. The method of claim 14, further comprising:
    preparing the one or more design files and performing timing analysis thereon prior to the prioritization and substitution.
22. The method of claim 14, further comprising:
    generating one or more design file outputs that encode representations of the semiconductor integrated circuit, including the substituted low threshold voltage gate instances.
23. A semiconductor integrated circuit comprising:
    a plurality of gate instances; and
    circuit paths defined through respective ones of the gate instances,
    wherein a subset of the gate instances are low threshold voltage variants substituted in the semiconductor integrated circuit based on a prioritization of the gate instances, the prioritization combining timing violations for each of the circuit paths through a particular gate instance, and wherein the substitution is constrained by a noise-related constraint evaluated at inputs of the particular gate instance.
24. The semiconductor integrated circuit of claim 23,
    wherein the noise-related constraint includes a node capacitance limit at each input of the particular gate instance.
25. The semiconductor integrated circuit of claim 23,
    wherein the noise-related constraint includes a limit on RC delay leading into each input of the particular gate instance.
26. The semiconductor integrated circuit of claim 23,
    wherein the substitution is further constrained by a leakage current constraint.
27. The semiconductor integrated circuit of claim 23,
    wherein the substituted subset is less than about 5%.
28. The semiconductor integrated circuit of claim 23,
    wherein the substituted subset ranges from approximately 3% to approximately 5% of the gate instances.
29. A computer readable encoding of a semiconductor integrated circuit design, the computer readable encoding comprising:
    one or more design file media encoding representations of a plurality of gate instances; and
    one or more design file media encoding representations of circuit paths defined through respective ones of the gate instances,
    wherein a subset of the gate instances are low threshold voltage variants substituted in the semiconductor integrated circuit based on a prioritization of the gate instances, the prioritization combining timing violations for each of the circuit paths through a particular gate instance, and wherein the substitution is constrained by a noise-related constraint evaluated at inputs of the particular gate instance.
30. The computer readable encoding of claim 29,
    wherein the noise-related constraint includes a node capacitance limit at each input of the particular gate instance.
31. The computer readable encoding of claim 29,
    wherein the noise-related constraint includes a limit on RC delay leading into each input of the particular gate instance.

32. The computer readable encoding of claim 29, wherein the substitution is further constrained by a leakage current constraint.

33. The computer readable encoding of claim 29, wherein each of the one or more design file media are selected from the set of a disk, tape or other magnetic, optical, semiconductor or electronic storage medium and a network, wireline, wireless or other communications medium.

34. The computer readable encoding of claim 29, wherein the substituted subset is less than about 5%.

35. The computer readable encoding of claim 29, wherein the substituted subset ranges from approximately 3% to approximately 5% of the gate instances.

36. An apparatus comprising:
  means for processing one or more design files for a semiconductor integrated circuit, the one or more design files encoding representations of a plurality gate instances and circuit paths therethrough;
  means for prioritizing at least a subset of the gate instances based on a metric that combines timing violations for each of plural paths therethrough that violate a delay constraint; and
  means for substituting at least some of the gate instance representations with respective low threshold voltage variants thereof, wherein the substitution is performed substantially in prioritized order and subject to a noise-related constraint evaluated at inputs of the prioritized gate instances.

37. A method of making a computer readable media product that encodes a design file representation of a semiconductor integrated circuit, the method comprising:
  preparing the one or more design files for the semiconductor integrated circuit and performing timing analysis thereon;
  prioritizing instances of at least some gates of the semiconductor integrated circuit using a metric that includes contributions corresponding to timing violations of plural paths therethrough;
  substituting, substantially in accordance with the prioritization and based at least in part on a substitution constraint, a subset of the gate instances with respective low $V_t$ variants thereof;
  generating one or more design file outputs that encode representations of the semiconductor integrated circuit, including the substituted low $V_t$ gate instances; and
  supplying the one or more design file outputs as at least part of the computer readable media product.

38. The method of claim 37, wherein the computer readable media product is embodied as one or more media selected from the set of a disk, tape or other magnetic, optical, semiconductor or electronic storage medium and a network, wireline, wireless or other communications medium.

39. A method of making a semiconductor integrated circuit, the method comprising:
  preparing the one or more design files for the semiconductor integrated circuit and performing timing analysis thereon;
  prioritizing instances of at least some gates of the semiconductor integrated circuit using a metric that includes contributions corresponding to timing violations of plural paths therethrough;
  substituting, substantially in accordance with the prioritization and based at least in part on a substitution constraint, a subset of the gate instances with respective low $V_t$ variants thereof; and
  fabricating the semiconductor integrated circuit, including the substituted low $V_t$ gate instances.

40. The method of claim 39, wherein the substitution constraint includes at least one noise-related constraint evaluated at inputs of the prioritized gate instances.

41. The method of claim 39, wherein the noise related constraint includes a node capacitance limit at each input of the prioritized gate instances.

42. The method of claim 39, wherein the noise related constraint includes a limit on RC delay leading into each input of the prioritized gate instances.

43. The method of claim 39, wherein the substitution constraint includes a limit on leakage current accumulated as a result of the gate instance substitutions.

* * * * *